(12) United States Patent
Ju

(10) Patent No.: US 7,402,050 B2
(45) Date of Patent: Jul. 22, 2008

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/524,965

(22) Filed: Sep. 22, 2006

(65) Prior Publication Data

US 2008/0085634 A1    Apr. 10, 2008

(51) Int. Cl.
*H01R 13/40* (2006.01)
(52) U.S. Cl. ...................................................... 439/66
(58) Field of Classification Search ................ 439/595, 439/862, 816, 828, 66
See application file for complete search history.

(56) References Cited

U.S. PATENT DOCUMENTS 4,408,824 A * 10/1983 Weidler ...................... 439/398
4,929,197 A * 5/1990 Finney ........................ 439/660
6,375,492 B1 * 4/2002 Hio ............................ 439/422
6,488,513 B1 * 12/2002 Neidich et al. ................ 439/66
6,676,456 B1 * 1/2004 Horng ........................ 439/862

* cited by examiner

*Primary Examiner*—Neil Abrams
*Assistant Examiner*—Phuong Nguyen
(74) *Attorney, Agent, or Firm*—Troxell Law Office, PLLC

(57) ABSTRACT

The present invention discloses an electrical connector, comprising an insulating body provided with a plurality of accommodating passages; an electrical terminal received in the accommodating passage and having a body and two contact portions extending from both ends of the body; and a holding terminal also received in the accommodating passage and arranged on one side of the electrical terminal to hold the electrical terminal. Compared with the conventional art, the electrical connector according to the present invention can maintain better resilience and thus ensure secure electrical connection with mating electronic components.

12 Claims, 6 Drawing Sheets

ELECTRICAL CONNECTOR

FIELD OF THE INVENTION

The present invention relates to an electrical connector, and in particular to an electrical connector which is used to connect the land grid array (LGA) chip module to a circuit board.

BACKGROUND OF THE INVENTION

The conventional art of an electrical connector usually connects the LGA chip module to a circuit board, wherein the electrical connector usually comprises electrical terminals. U.S. Pat. No. 6,488,513 discloses an electrical connector which can provide densely spaced contact pads on both ends to compressingly contact with mating electronic components, comprising electrical terminals and an insulating body, wherein the electrical terminal is a C-shape comprising an upper and lower resilient contact arms as well as a body. The upper and lower resilient contact arms extend from the opposite sides of the insulating main body and the lower resilient arm is generally a shape of inclined slot whose end can be pressed against the metal contact of the electronic component (electrical circuit).

However, the drawback of the aforementioned US patent lies in the fact that the poor fatigue resistance of the electrical terminal will negatively affect the electrical connection with its mating electronic components when the resilience of the terminal diminishes after repetitive uses.

Consequently, it is necessary to design a new electrical connector to overcome the aforementioned drawback.

SUMMARY OF THE INVENTION

One object of the present invention is to provide an electrical connector which can ensure a secure electrical connection between two mating electronic components.

To achieve the aforementioned object, the electrical connector according to the present invention comprises an insulating body provided with a plurality of accommodating passages; an electrical terminal received in the accommodating passage and having a body and two contact portions extending from both ends of the body; and a holding terminal also received in the accommodating passage and arranged on one side of the electrical terminal to hold the electrical terminal.

Compared with the conventional art, the electrical connector according to the present invention can maintain better resilience and thus ensure secure electrical connection with mating electronic components.

BRIEF DESCRIPTION OF THE DRAWINGS

The present invention can be more fully understood by reference to the following description and accompanying drawings, in which.

DETAILED DESCRIPTION OF THE INVENTION

Figure 1:
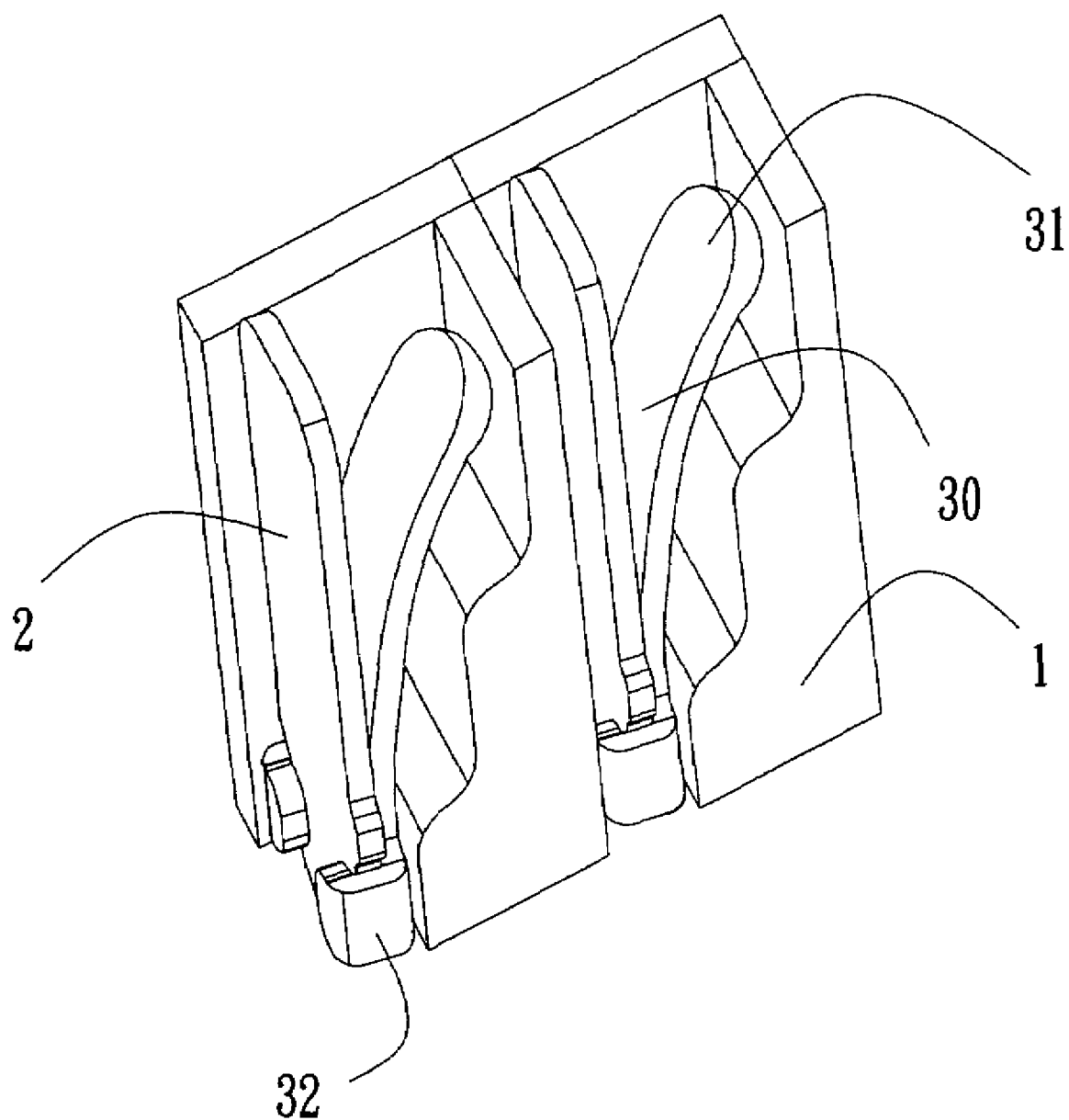
FIG. 1 schematically illustrates a local perspective assembly view of a preferred embodiment of the electrical connector according to the present invention.
Figure 2:
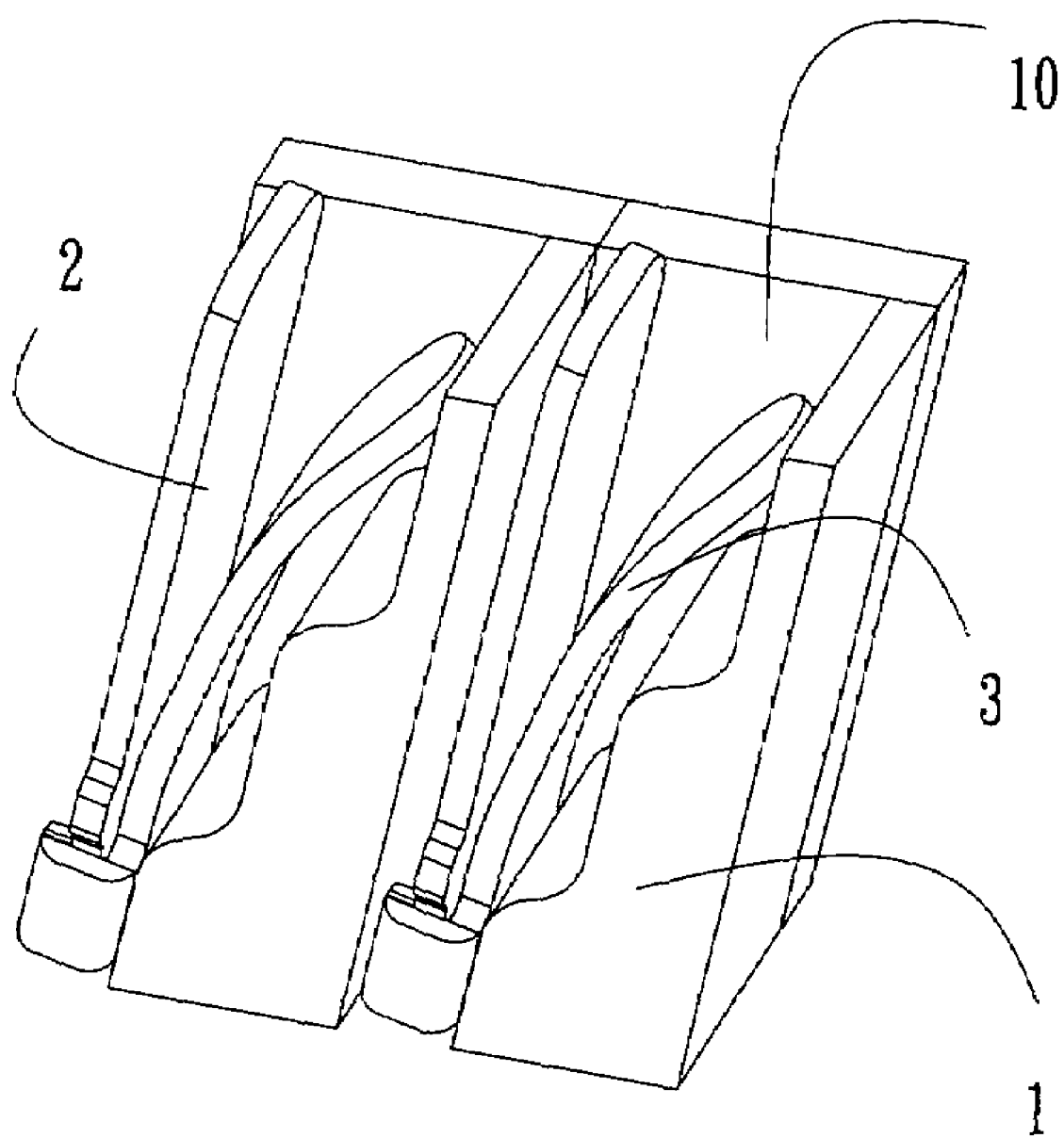
FIG. 2 schematically illustrates a local perspective view of the electrical connector in FIG. 1 from another view angle.
Figure 3:
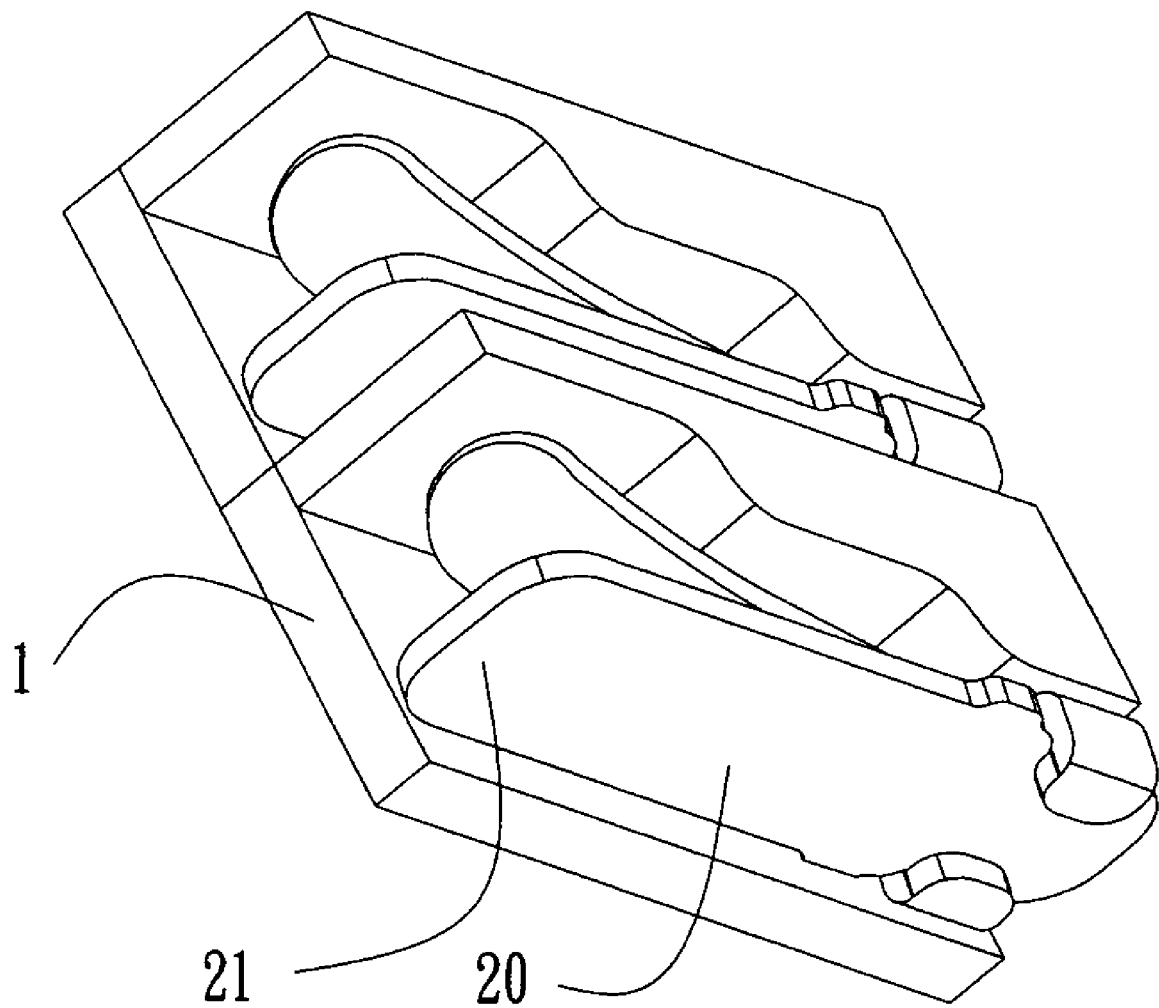
FIG. 3 schematically illustrates a local perspective view of the electrical connector in FIG. 1 from yet another view angle.

With reference to FIGS. 1 to 3, the electrical connector according to the present invention is to establish electrical connection between two mating electronic components, for example but not limited to, connecting the Land Grid Array (LGA) chip module to a circuit board (both not shown). Of course, the electrical connector can also establish electrical connection for other electronic components, for example but not limited to, two circuit boards and so on. The electrical connector according to the present invention comprises an insulating body 1; an electrical terminal 2; and a holding terminal 3 for holding the electrical terminal 2, wherein the insulating body 1 is provided with a plurality of accommodating passages 10 and the electrical terminal 2 and the holding terminal 3 are received in the accommodating passage 10. The holding terminal 3 is, for example but not limited to, arranged on one side of the electrical terminal 2.

The electrical terminal 2 and the holding terminal 3 having a strip shape are both received in the accommodating passage 10. The electrical terminal 2 further comprises a body 20 and two contact portions 21 extending from both ends of the body 20, wherein the contact portions 21 are staggered with respective to each other vertically. The body 20 may be secured in the accommodating passage 10 of the insulating body 1 so as to secure the electrical terminal 2 in the insulating body 1.

The holding terminal 2 is a curve shape and cannot transmit electrical signal, comprising a retaining portion 30 and a counter portion 31 extending from the retaining portion 30, wherein the counter portion 31 may be abut against the insulating body 1. When the mating electronic component is connected with the electrical terminal 2, the electrical terminal 2 will abut against the holding terminal 3 to provide adequate resilience to ensure better electrical connection between the electrical terminal 2 and the mating electronic component. When the mating electronic component is disengaged, the electrical terminal 2 may return to original shape due to the resilience of the holding terminal 3.

The holding terminal 3 further comprises a fastening portion which may operate in coordination with the electrical terminal 2. The fastening portion is, for example but not limited to, a clamp mechanism 32 which may clamp the electrical terminal 2. The clamp mechanism 32 may form by extending from the retaining portion 30 and bending therefrom, so as to securingly fasten the electrical terminal 2 and the holding terminal 3 together.

Figure 4:
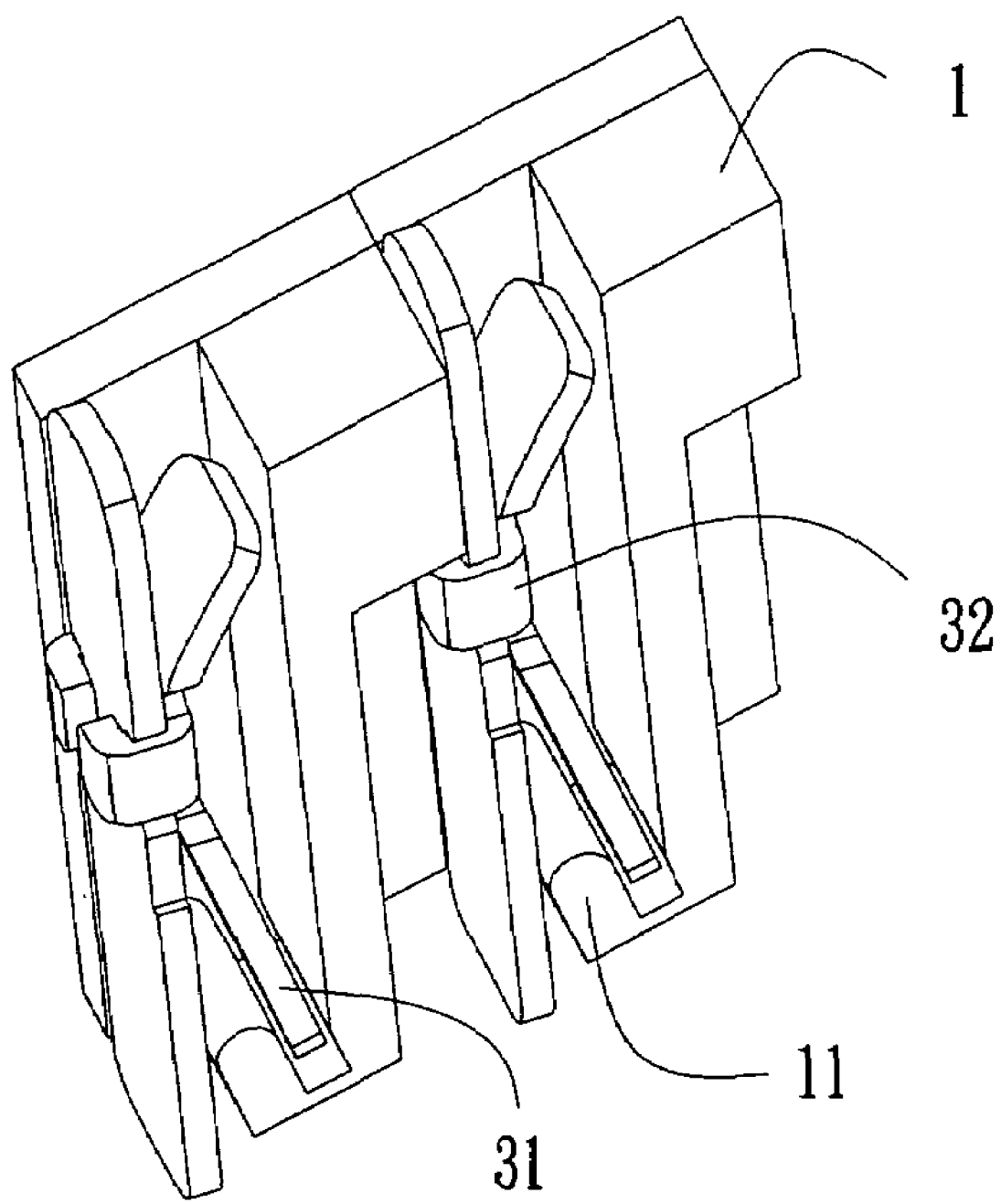
FIG. 4 schematically illustrates a local perspective assembly view of another preferred embodiment of the electrical connector according to the present invention.
Figure 5:
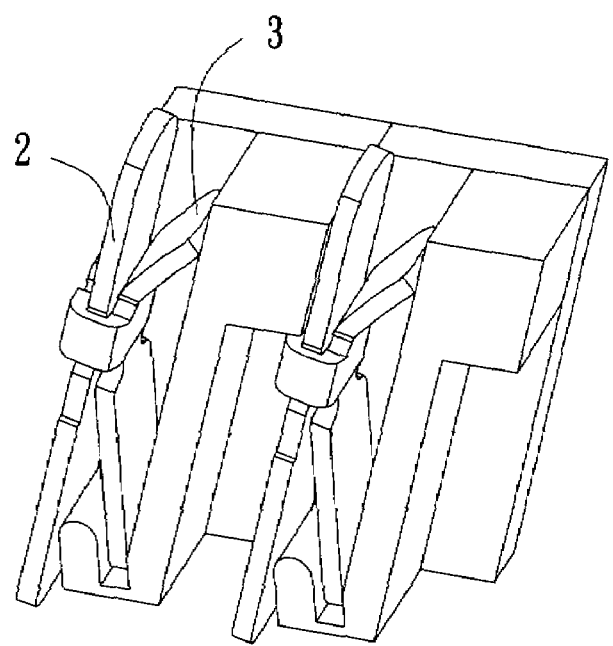
FIG. 5 schematically illustrates a local perspective view of the electrical connector in FIG. 4 from another view angle.

FIGS. 4 and 5 schematically show the perspective view of another embodiment of the electrical connector according to the present invention. The difference between the second embodiment and the first embodiment lies in the fact that the clamp mechanism 32 is arranged in the middle of the holding terminal 3 and both ends of the holding terminal 3 is disposed with the counter portion 31, respectively, to abut against the insulating body 1. The insulating body 1 is disposed with a locating portion 11 to locate the holding terminal 3. The counter portion 31 on one end of the holding terminal 3 is arranged on the locating portion 11 so as to achieve the same effect as the aforementioned embodiment.

Figure 6:
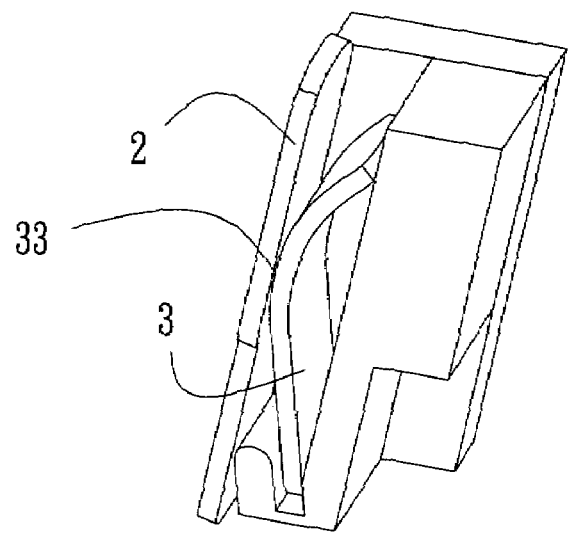
FIG. 6 schematically illustrates a local perspective view of the electrical connector in FIG. 4 from yet another view angle.

FIG. 6 schematically shows the perspective view of yet another preferred embodiment of the electrical connector according to the present invention. The difference between the present embodiment and the first embodiment lies in the fact that the electrical terminal 2 and the holding terminal 3 are both a strip shape and the fastening portion may be an opposing portion 33 to abut against the electrical terminal 2 so as to achieve the same effect as the aforementioned embodiment.

Figure 7:
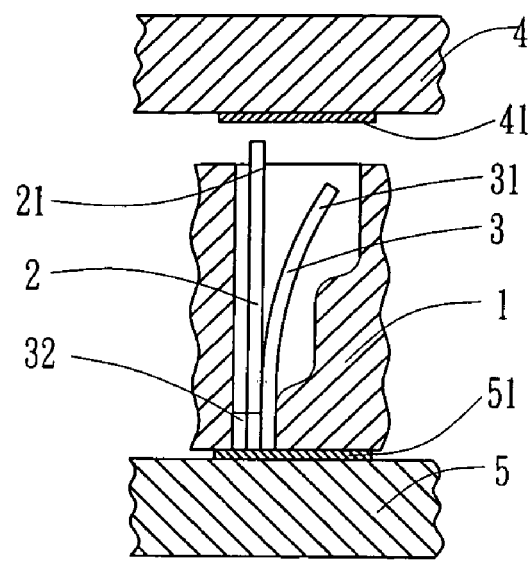
FIG. 7 schematically illustrates the status of the electrical connector in use.

FIG. 7 schematically illustrates the status of the electrical terminal 2 and holding terminal 3 when the chip module 4 has not been pressed on the electrical connector.

Figure 8:
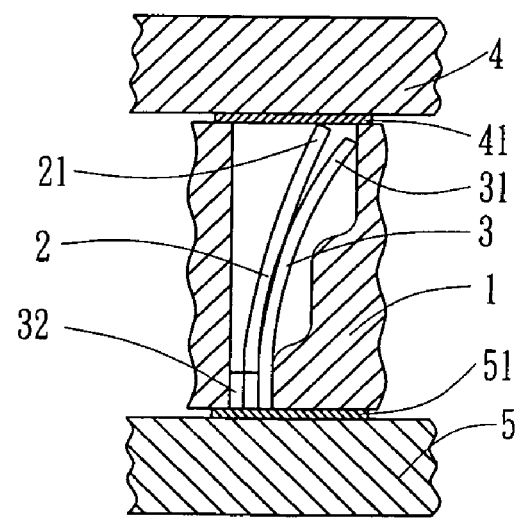
FIG. 8 schematically illustrates the status of the electrical connector in use.

FIG. 8 schematically illustrates the status of the electrical terminal 2 and holding terminal 3 when the chip module 4 has been pressed on the electrical connector. When the electrical terminal 2 is pressed on the electrical terminal 2, the electrical terminal 2 will tilt and then press on the holding terminal 3, thus causes the holding terminal 3 also tilting and changing shape, but finally, the free end 31 of the holding terminal 3 will about against the inner wall of the insulation body 1, so as to protect the electrical terminal 2 from over tilting and changing shape.

Consequently, with the holding terminal 3, the electrical connector according to the present invention may provide better resilience for the electrical terminal 2 to ensure a better electrical connection with the mating electronic component, which can overcome the drawbacks of the conventional art.

While the invention has been described with reference to the a preferred embodiment thereof, it is to be understood that modifications or variations may be easily made without departing from the spirit of this invention, which is defined by the appended claims.

What is claimed is:

1. An electrical connector comprising:
   a) an insulating body having a plurality of accommodating passages;
   b) a plurality of electrical terminals, each of the plurality of electrical terminals has a body and two contact portions located on opposing ends of the body; and
   c) a plurality of holding terminals being non-signal transmitting elements, one electrical terminal and one holding terminal are located in a corresponding accommodating passage of the plurality of accommodating passages, one of the plurality of holding terminals holding each of the plurality of electrical terminals in the corresponding accommodating passage, wherein each of the plurality of holding terminals has a retaining portion and a counter portion extending from the retaining portion and abutting the insulating housing.

2. The electrical connector according to claim 1, wherein each of the plurality of electrical terminals has a strip shape.

3. The electrical connector according to claim 1, wherein each of the plurality of holding terminals has a curved shape.

4. The electrical connector according to claim 1, wherein each of the plurality of holding terminals has a retaining portion and two counter portions extending from opposing ends thereof, the two counter portions abutting the insulating housing.

5. The electrical connector according to claim 1, wherein each of the plurality of electrical terminals and each of the plurality of holding terminals has a strip shape.

6. The electrical connector according to claim 1, wherein each of the plurality of holding terminals has a fastening portion engaging a selected one of the plurality of electrical terminals.

7. The electrical connector according to claim 6, wherein each fastening portion is a clamp mechanism securing each of the plurality of holding terminals to the selected one of the plurality of electrical terminals.

8. The electrical connector according to claim 7, wherein each of the plurality of holding terminals has a retaining portion and a counter portion extending from the retaining portion and abutting the insulating housing.

9. The electrical connector according to claim 7, wherein each of the plurality of holding terminals has a retaining portion and two counter portions extending from opposing ends thereof, the two counter portions abutting the insulating housing.

10. The electrical connector according to claim 6, wherein each fastening portion is an opposing portion engaging the selected one of the plurality of electrical terminals.

11. The electrical connector according to claim 10, wherein each of the plurality of holding terminals has a retaining portion and a counter portion extending from the retaining portion and abutting the insulating housing.

12. The electrical connector according to claim 10, wherein each of the plurality of holding terminals has a retaining portion and two counter portions extending from opposing ends thereof, the two counter portions abutting the insulating housing.

* * * * *